(12) United States Patent
Zhang et al.

(10) Patent No.: US 8,822,291 B2
(45) Date of Patent: Sep. 2, 2014

(54) HIGH VOLTAGE DEVICE

(75) Inventors: Guowei Zhang, Singapore (SG); Purakh Raj Verma, Singapore (SG)

(73) Assignee: Globalfoundries Singapore Pte. Ltd., Singapore (SG)

(*) Notice: Subject to any disclaimer, the term of this patent is extended or adjusted under 35 U.S.C. 154(b) by 0 days.

(21) Appl. No.: 13/598,605

(22) Filed: Aug. 29, 2012

(65) Prior Publication Data

US 2013/0181287 A1  Jul. 18, 2013

Related U.S. Application Data

(63) Continuation-in-part of application No. 13/352,248, filed on Jan. 17, 2012.

(51) Int. Cl.
*H01L 21/336* (2006.01)
*H01L 29/66* (2006.01)

(52) U.S. Cl.
USPC .......................................... 438/286; 257/340

(58) Field of Classification Search
USPC ............ 438/286; 257/340, E21.417, E29.256
See application file for complete search history.

(56) References Cited

U.S. PATENT DOCUMENTS

| | | | | |
|---|---|---|---|---|
| 6,492,678 B1 * | 12/2002 | Hebert | ........................... | 257/331 |
| 6,593,621 B2 * | 7/2003 | Tsuchiko et al. | ............. | 257/335 |
| 6,744,101 B2 * | 6/2004 | Long et al. | ..................... | 257/368 |
| 6,998,680 B2 * | 2/2006 | Kitamura et al. | ............. | 257/342 |
| 7,374,982 B2 * | 5/2008 | Hebert | ........................... | 438/159 |
| 7,427,795 B2 * | 9/2008 | Pendharkar | ................... | 257/335 |
| 7,667,267 B2 * | 2/2010 | Yamada | ........................ | 257/335 |
| 7,737,494 B2 * | 6/2010 | Tanaka | .......................... | 257/335 |
| 7,851,883 B2 * | 12/2010 | Inoue et al. | ................... | 257/493 |
| 7,951,680 B2 * | 5/2011 | Zhang et al. | .................. | 438/300 |
| 8,174,071 B2 * | 5/2012 | Tien et al. | ..................... | 257/343 |
| 2005/0012088 A1 | 1/2005 | Ohuchi et al. | | |
| 2007/0080398 A1 * | 4/2007 | Lee et al. | ...................... | 257/340 |
| 2008/0173940 A1 * | 7/2008 | Miller et al. | .................. | 257/339 |

(Continued)

FOREIGN PATENT DOCUMENTS

JP          09321291 A  * 12/1997

OTHER PUBLICATIONS

Cui, Ying "p-type doping and codoping of ZnO based on nitrogen is ineffective: An ab initio clue" App. Phys. Lett. 97 Iss. 4 Jul. 28, 2010 pp. 1-3.*

(Continued)

*Primary Examiner* — Yu-Hsi D Sun
*Assistant Examiner* — Grant Withers
(74) *Attorney, Agent, or Firm* — Horizon IP Pte. Ltd.

(57) ABSTRACT

A method of forming a device is disclosed. A substrate having a device region is provided. The device region comprises a source region, a gate and a drain region defined thereon. A drift well is formed in the substrate adjacent to a second side of the gate. The drift well underlaps a portion of the gate with a first edge of the drift well beneath the gate. A secondary portion is formed in the drift well. The secondary portion underlaps a portion of the gate with a first edge of the secondary portion beneath the gate. The first edge of the secondary portion is offset from the first edge of the drift well. A gate dielectric of the gate comprises a first portion having a first thickness and a second portion having a second thickness. The second portion is over the secondary portion.

18 Claims, 24 Drawing Sheets

(56) References Cited

U.S. PATENT DOCUMENTS

| | | |
|---|---|---|
| 2008/0237703 A1 | 10/2008 | Lin et al. |
| 2008/0242033 A1* | 10/2008 | Levin et al. .................. 438/286 |
| 2009/0068804 A1 | 3/2009 | Pendharkar |
| 2009/0302385 A1* | 12/2009 | Chu et al. ...................... 257/343 |
| 2010/0032754 A1* | 2/2010 | Kawaguchi .................. 257/337 |
| 2010/0109080 A1* | 5/2010 | Huang et al. ................. 257/335 |
| 2010/0109097 A1* | 5/2010 | Zhang et al. ................. 257/408 |
| 2010/0148258 A1* | 6/2010 | Cho .............................. 257/343 |
| 2010/0173463 A1* | 7/2010 | Kim .............................. 438/286 |
| 2010/0213543 A1* | 8/2010 | Zhang et al. ................. 257/335 |
| 2010/0213544 A1* | 8/2010 | Liu et al. ...................... 257/339 |
| 2010/0327349 A1* | 12/2010 | Arie et al. .................... 257/340 |
| 2011/0042743 A1* | 2/2011 | Chu et al. ..................... 257/343 |
| 2011/0156142 A1* | 6/2011 | Teo et al. ..................... 257/336 |
| 2011/0198690 A1* | 8/2011 | Hu et al. ...................... 257/336 |
| 2011/0233672 A1* | 9/2011 | Chang et al. ................. 257/339 |
| 2011/0241114 A1* | 10/2011 | Su et al. ....................... 257/343 |
| 2012/0091527 A1* | 4/2012 | You .............................. 257/343 |
| 2012/0094457 A1* | 4/2012 | Gabrys ......................... 438/286 |
| 2012/0098041 A1* | 4/2012 | Verma .......................... 257/288 |
| 2012/0112275 A1* | 5/2012 | Steinmann et al. ........... 257/335 |
| 2012/0119293 A1* | 5/2012 | Chu et al. ..................... 257/335 |
| 2012/0228704 A1* | 9/2012 | Ju ................................. 257/339 |
| 2012/0241862 A1* | 9/2012 | Zhang et al. ................. 257/339 |
| 2012/0273879 A1* | 11/2012 | Mallikarjunaswamy et al. ............................. 257/335 |
| 2012/0273885 A1* | 11/2012 | Banerjee et al. ............. 257/343 |
| 2012/0313166 A1* | 12/2012 | Ito ................................ 257/336 |
| 2013/0001688 A1* | 1/2013 | Verma .......................... 257/337 |
| 2013/0026565 A1* | 1/2013 | Verma et al. ................. 257/335 |
| 2013/0093012 A1* | 4/2013 | Zhang et al. ................. 257/335 |
| 2013/0126969 A1* | 5/2013 | Lee et al. ..................... 257/335 |
| 2013/0140626 A1* | 6/2013 | Shrivastava et al. ......... 257/328 |
| 2013/0181285 A1* | 7/2013 | Ng et al. ...................... 257/335 |
| 2013/0181286 A1* | 7/2013 | Zhang .......................... 257/335 |
| 2013/0187218 A1* | 7/2013 | Lai et al. ...................... 257/328 |
| 2013/0207185 A1* | 8/2013 | Huang et al. ................. 257/339 |
| 2013/0214354 A1* | 8/2013 | Chan ............................ 257/339 |
| 2013/0256795 A1* | 10/2013 | Tsuchiko ..................... 257/343 |

OTHER PUBLICATIONS

Barbadillo, L. "Low-energy carbon and nitrogen ion implantation in silicon" J. Vac. Sci. Technol. B 19(4) Jul./Aug. 2001 pp. 1124-1132.*

Nishioka et al., Dramatic Improvement of Hot-Electron-Induced Interface Degradation in MOS Structures Containing F or Cl in SiO2, IEEE Electron Device Letters, Jan. 1988, pp. 38-40, vol. 9, IEEE.

Kasai et al., Hot-Carrier-Degradation Characteristics for Fluorine-Incorporated nMOSFET's, IEEE Transactions on Electron Devices, Jun. 1990, pp. 1426-1431, vol. 6, IEEE.

* cited by examiner

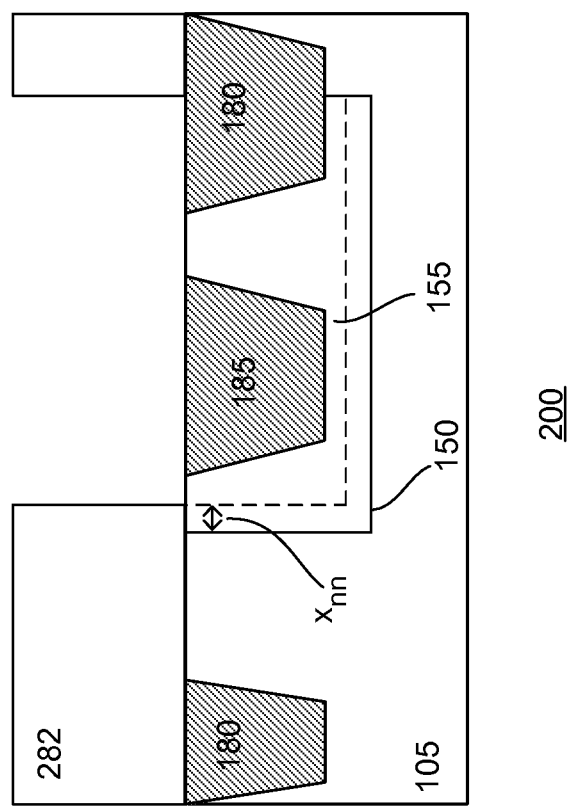

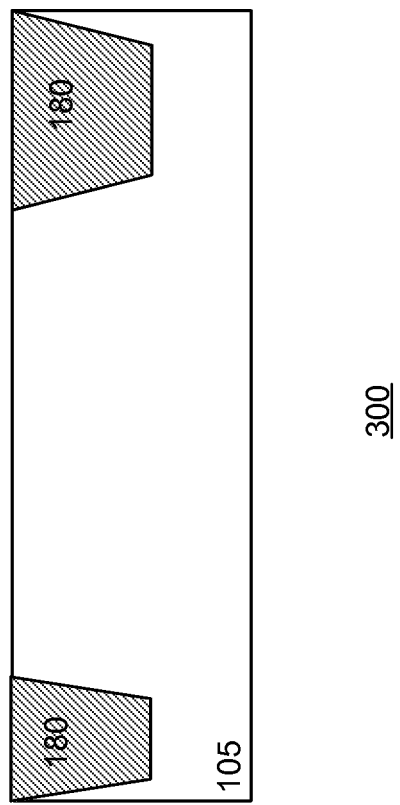

HIGH VOLTAGE DEVICE

CROSS-REFERENCE TO RELATED APPLICATION

This application is a continuation-in-part application which claims benefit of co-pending U.S. patent application Ser. No. 13/352,248, filed on Jan. 17, 2012. All disclosures are incorporated herewith by reference.

BACKGROUND

Lateral Double-Diffused (LD) transistors have been widely employed in high voltage applications. One factor which affects the performance of the LD transistors is the gate to drain capacitance ($C_{gd}$). For example, lower $C_{gd}$ enables faster switching of LDMOS drivers.

Conventional techniques in achieving low $C_{gd}$ can result in increased drain-to-source on-resistance ($R_{dson}$), which, in turn, undesirably decreases switching speed.

The disclosure is directed to transistors with fast switching speed.

SUMMARY

A method of forming a device is disclosed. In one embodiment, the method includes providing a substrate having a device region. The device region is defined with a source region, a gate and a drain region. The method also includes forming a drift well in the substrate adjacent to a second side of the gate. The drift well underlaps a portion of the gate with a first edge of the drift well beneath the gate. The method also includes forming a secondary portion in the drift well. The secondary portion underlaps a portion of the gate with a first edge of the secondary portion beneath the gate. The first edge of the secondary portion is offset from the first edge of the drift well. A gate dielectric of the gate comprises a first portion having a first thickness and a second portion having a second thickness, the second portion is over the secondary portion.

In one embodiment, a method of forming a semiconductor device is disclosed. The method includes providing a substrate having a device region. The device region is defined with a source region, a gate and a drain region. The method also includes forming a drift well having first polarity type dopants in the substrate adjacent to a second side of the gate. The drift well underlaps a portion of the gate with a first edge of the drift well beneath the gate. The method also includes forming a secondary portion having neutral dopants in the drift well. The secondary portion underlaps a portion of the gate with a first edge of the secondary portion beneath the gate. The first edge of the secondary portion is offset from the first edge of the drift well. A gate dielectric of the gate comprises a first portion having a first thickness and a second portion having a second thickness. The second portion is over the secondary portion.

In yet another embodiment, a semiconductor device is disclosed. The semiconductor device includes a substrate having a device region. The device region is defined with a source region, a gate and a drain region. The semiconductor device also includes a drift well in the substrate adjacent to a second side of the gate. The drift well underlaps a portion of the gate with a first edge of the drift well beneath the gate. The semiconductor device also includes a secondary portion having neutral dopants in the drift well. The secondary portion underlaps a portion of the gate with a first edge of the secondary portion beneath the gate. The first edge of the secondary portion is offset from the first edge of the drift well. A gate dielectric of the gate comprises a first thickness for a first portion and a second thickness for a second portion. The second portion is over the secondary portion.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-i show an embodiment of a process for forming a device;
and
FIGS. 3a-k show another embodiment of a process for forming a device.

DETAILED DESCRIPTION

Figure 1A:
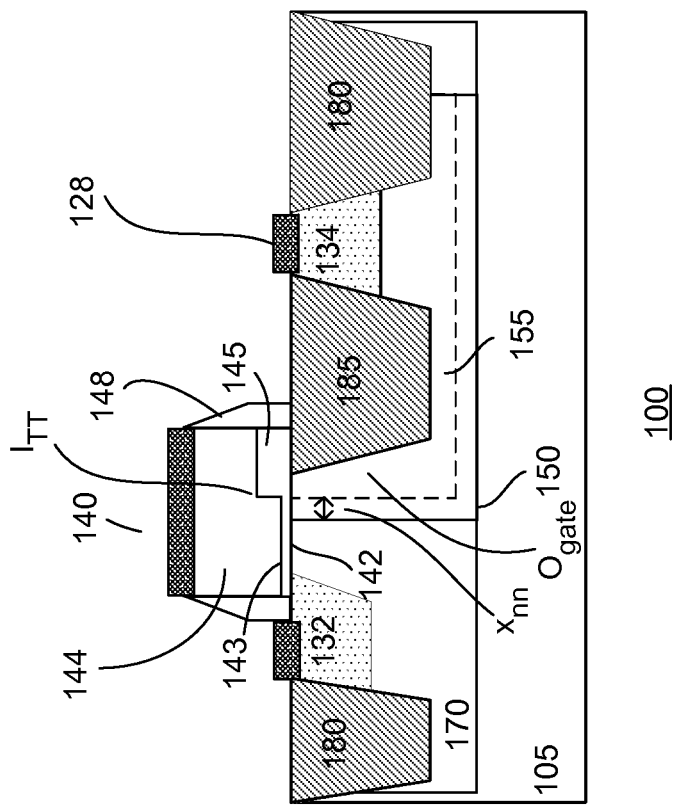
FIGS. 1a-d show embodiments of a device.

Embodiments generally relate to semiconductor devices or integrated circuits (ICs). More particularly, some embodiments relate to high power devices. For example, high power devices include lateral double-diffused (LD) transistors, such as metal oxide transistors (MOS). The high power devices can be employed as switching voltage regulators for power management applications. The LD transistors can be easily integrated into devices or ICs. The devices or ICs can be incorporated into or used with, for example, consumer electronic products, and particularly portable consumer products, such as cell phones, laptop computers and personal digital assistants (PDAs).

FIGS. 1a-d show cross-sectional views of a portion of embodiments of a device 100. The device, for example, is an IC. In one embodiment, the device is a laterally diffused metal oxide semiconductor (LDMOS). Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped ($x$) and lightly doped ($x^-$) regions, where x is the polarity type which can be p or n. A lightly doped region may have a dopant concentration of about $1E11$-$1E13/cm^2$, and an intermediately doped region may have a dopant concentration of about $1E13$-$1E15/cm^2$, and a heavily doped region may have a dopant concentration of about $1E15$-$1E17/cm^2$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

The substrate includes a device region. The device region, for example, is a high voltage (HV) device region for a high voltage device, such as a high voltage transistor. In one embodiment, the device region includes a LD transistor. Providing other types of devices in the device region may also be useful. The substrate may also include regions for other types of circuitry, depending on the type of device or IC. For example, the device may also include regions for intermediate voltage (IV) and low voltage (LV) voltage devices as well as an array region for memory devices.

Isolation regions may be provided for isolating or separating different regions of the substrate. In one embodiment, the device region is isolated from other regions by a device isolation region 180. For example, the device isolation region surrounds the device region. The isolation region, for example, is a shallow trench isolation (STI) region. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

The transistor includes a gate 140 on the surface of the substrate. The width of the gate along a channel length direction of the transistor, for example, is about 0.5-10 μm. Providing a gate having other widths may also be useful. The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate, for example, includes a gate electrode 144 over a gate dielectric 142. The gate electrode, for example, may be polysilicon. The gate electrode may be about 700-5000 Å thick. Other types of gate electrodes as well as thicknesses may also be useful. As for the gate dielectric, it may be formed of silicon oxide. Other types of gate dielectrics may also be useful.

In one embodiment, the gate dielectric is hybrid gate dielectric, having first and second portions 143 and 145 along a width direction of the gate. The width direction is from one side of the gate to the other side along the width direction. For example, the width direction is from the source side of the gate to the drain side. The first portion of the hybrid gate dielectric has a first thickness $T_1$ and the second portion of the gate dielectric has a second thickness $T_2$. The first and second portions form an interface $I_{TT}$. In one embodiment, the first portion is adjacent to the source and the second portion is adjacent to the drain. For example, the gate dielectric portion adjacent to the source is thinner than the gate dielectric portion adjacent to the drain (e.g., $T_1 < T_2$). The thickness $T_1$, for example, is about 50-500 Å while the thickness for $T_2$ is about 100-1000 Å. Other thicknesses for $T_1$ and $T_2$ may also be useful. The configuration ensures that a thinner gate dielectric over the channel of the transistor for faster switching speed and a thicker gate dielectric adjacent to the drain for lower gate to drain capacitance ($C_{gd}$). Additionally, the thicker gate dielectric on the drain side increases the breakdown voltage, improving reliability.

The transistor also includes first and second doped regions 132 and 134 disposed in the substrate on first and second sides of the gate. For example, the first doped region is disposed on the first side of the gate and the second doped region is disposed on the second side of the gate. The doped regions, in one embodiment, are heavily doped with first polarity type dopants for a first type transistor. For example, the doped regions are heavily doped n-type ($n^+$) regions for a n-type transistor. Providing heavily doped p-type ($p^+$) regions may also be useful for a p-type transistor. The heavily doped regions, for example, have a dopant concentration of about $1E15$-$1E17/cm^2$. Other dopant concentrations for the doped regions may also be useful. The depth of the doped regions may be about 0.1-0.4 μm. Providing doped regions having other depths may also be useful. Additionally, it is not necessary that the first and second doped regions have the same depth.

In one embodiment, the first doped region serves as a source region of the transistor. The source region is adjacent to the first side and underlaps the gate. The underlap portion should be sufficient for the source region to be in communication with the channel under the gate. The underlap portion may be, for example, about 0.1-0.3 μm. An underlap portion which underlaps the gate by other amounts may also be useful. In one embodiment, the underlap portion of the source region is a lightly doped source (LDS) region. Other configurations of the first doped region may also be useful.

Sidewalls of the gate may be provided with dielectric spacers 148. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer and main spacer. The offset spacers may facilitate forming the LDS region while the main spacers facilitate forming heavily doped source and drain regions. Other configurations of spacers may also be useful. For example, the spacer may be a single spacer. The LDS region is formed prior to forming the spacers while the spacers facilitate forming the heavily doped source and drain regions. In some cases, the transistor may also include halo regions. Halo regions are second polarity doped regions abutting the S/D regions proximate to the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on the channel of the transistor to improve performance.

In one embodiment, an internal isolation region 185 is disposed within the device region. The internal isolation region may be an STI region. Other types of isolation regions may also be useful. Preferably, the internal isolation region is the same type of isolation region as the device isolation region. Providing an internal isolation region which is different from the device isolation region may also be useful. The internal isolation region, for example, is disposed in the device region along a channel width direction of the transistor between the gate and drain. The internal isolation, for example, extends from one side to the other side of the device region along the channel width direction. Other configurations of the device and internal isolation regions may also be useful. As shown, the gate overlaps the internal isolation region. For example, the internal isolation region extends under the second side of the gate by about 0.1-2 μm. Providing an internal isolation region which extends under the second side of the gate by other width may also be useful. Providing the internal isolation region which underlaps the gate protects the edge of the gate dielectric from high electric field during operation. The width of the internal isolation region, for example, may be about 0.5-10 μm. Other widths may also be useful, depending on the drain voltage. The width and depth of the internal isolation region may determine a drift length of the transistor. In other embodiments, no internal isolation region is provided, as shown in FIG. 1d.

A first device well 150 is disposed in the substrate in the device region. The first device well serves as a drift well. The drift well includes first polarity type dopants. In one embodiment, the dopant concentration of the drift well is lower than the dopant concentration of the drain. In one embodiment, the drift well may be a lightly or an intermediately doped (x) with first polarity type dopants. For example, the dopant concentration of the drift well is about $1E12$-$1E14/cm^2$. Other dopant concentrations may also be useful. The dopant concentration, for example, may depend on the maximum or breakdown voltage requirement of the device.

The drift well connects the drain region to the channel of the transistor. The drift well, for example, is disposed below the drain region and extends under the gate. The gate overlaps the drift well, creating a gate overlap region $O_{gate}$ in the drift well. In the case of where an internal isolation region is provided, the $O_{gate}$ is between an edge of the drift well (e.g., inner edge of the drift well) under the gate and an edge of the internal isolation region (e.g., inner edge of the internal isolation region) under the gate. The $O_{gate}$ region should be sufficiently wide to provide the desired on resistance and drive current. In one embodiment, $O_{gate}$ is about 0.4-1 μm. Providing other values of $O_{gate}$ may also be useful. The width, for example, may depend on design requirements.

In one embodiment, the depth or bottom of the drift well is below the device isolation and internal device isolation regions. For example, the drift well extends from a bottom of the device isolation region to under the gate. The depth of the drift well may be about 0.5-5 μm. Other depths may also be useful. The depth, for example, may depend on the design voltage of the device. The substrate under the gate between the source region and drift well forms a channel of the transistor. The distance from the drain and around the internal isolation region to the channel under the gate is the drift distance of the transistor.

In one embodiment, a portion of the drift well includes a secondary portion 155. The secondary portion, for example, includes neutral dopants in addition to the first polarity type dopants. The secondary portion of the drift well enhances or increases oxide growth rate on the substrate surface over it as compared to the portion or portions without the neutral dopants. Due to the neutral dopants, the enhanced growth rate is achieved without negatively impacting the semiconductor behavior of the drift well. Neutral dopants, for example, may include fluorine (F), chlorine (Cl), germanium (Ge), silicon (Si) or a combination thereof. Other types of neutral dopants or a combination of neutral dopants may also be useful. The secondary portion should contain a sufficient dopant concentration of neutral dopants to increase oxide growth rate. The higher the dopant concentration, the greater the enhancement in growth rate. In one embodiment, the dopant concentration of neutral dopants in the secondary portion is about $1E14$-$1E16/cm^2$. Other dopant concentrations for the secondary portion may also be useful.

The secondary portion, as discussed, is disposed in the drift well. In one embodiment, a first edge of the secondary portion is aligned with the interface $I_{TT}$ of the gate dielectric. In one embodiment, the first edge of the secondary portion does not extend beyond an inner edge of the drift well. For example, the first edge of the secondary portion does not extend beyond the $O_{gate}$ and into a channel of the transistor, which is located between the source and the drift well. Preferably, the first edge of the secondary portion is offset from the inner edge of the drift well, leaving at least a portion without neutral dopants $X_{nn}$ in the $O_{gate}$ region. This ensures that the thicker portion of the gate dielectric is not over the channel portion. In one embodiment, a second edge of the secondary portion extends beyond the gate edge on the second side of the gate and within the outer edge of the drift well. Providing a second edge of the secondary portion which is aligned with the outer edge of the drift well may also be useful. In other embodiments, the second edge of the secondary portion extends beyond the outer edge of the drift well. The depth of the secondary portion should be sufficient to cause the gate dielectric over it to have enhanced growth rate. For example, the depth of the secondary portion may be about 0.01 to 0.1 μm. In one embodiment, the depth of the secondary portion is shallower than a depth of the drift well. Providing the secondary portion having other depths may also be useful. For example, the depth of the secondary portion may be equal to about the depth of the drift well or deeper than the drift well.

A second device well 170 may be disposed in the substrate. The second device well is disposed within the device isolation region. The second device well includes second polarity dopants for a first polarity type device. For example, the second device well comprises p-type dopants for an n-type device or n-type dopants for a p-type device. The second device well serves as a body of the transistor. For example, the second device well serves to form the channel of the transistor between the source and drift well. The dopant concentration of the second device well may be, in one embodiment, light to intermediate. For example, the dopant concentration of the second device well may be about $1E12$-$1E14/cm^2$. Other dopant concentration for the second device well may also be useful.

Figure 1B:
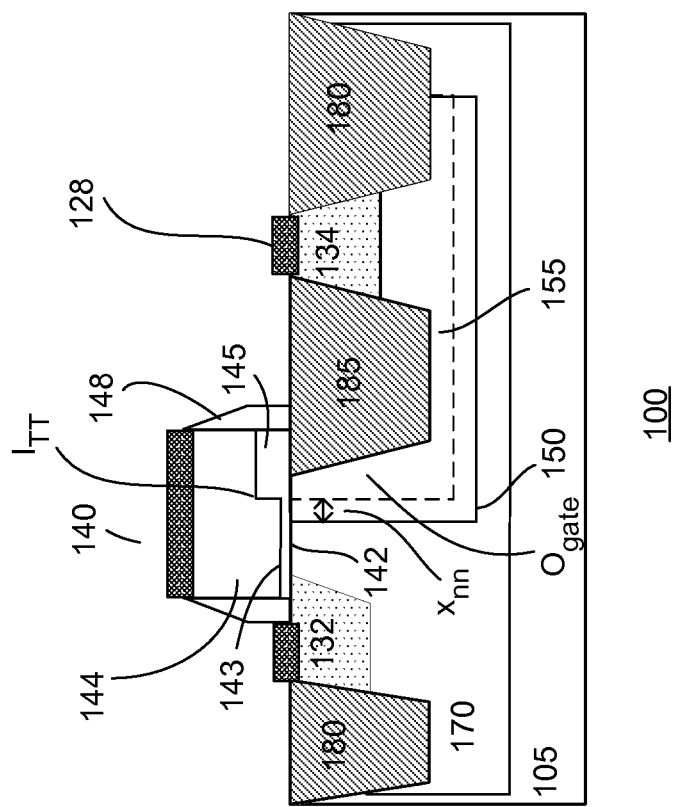

In one embodiment, the second device well may be at about the same depth as the drift well, as shown in FIG. 1a. The second device well, for example, may be disposed in the substrate in the device region on both sides of the drift well. Providing a second device well having other depths may also be useful. The second device well may be deeper than the drift well, as shown in FIG. 1b. For example, the second device well may encompass the source, drain, drift well and internal device isolation region. Other configurations of the device and drift well may also be useful. Providing a second device well that is shallower than the drift well may also be useful.

Figure 1C:
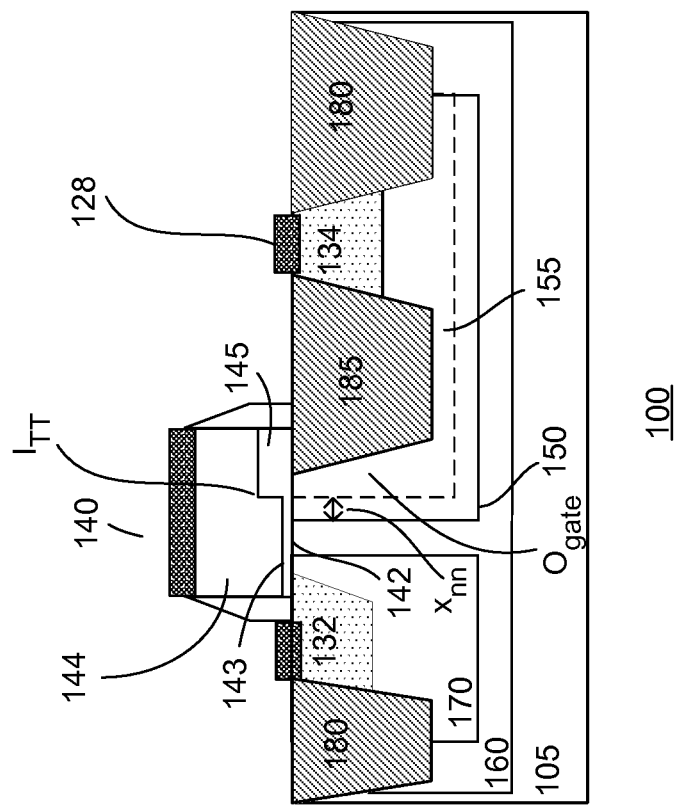
Figure 1D:
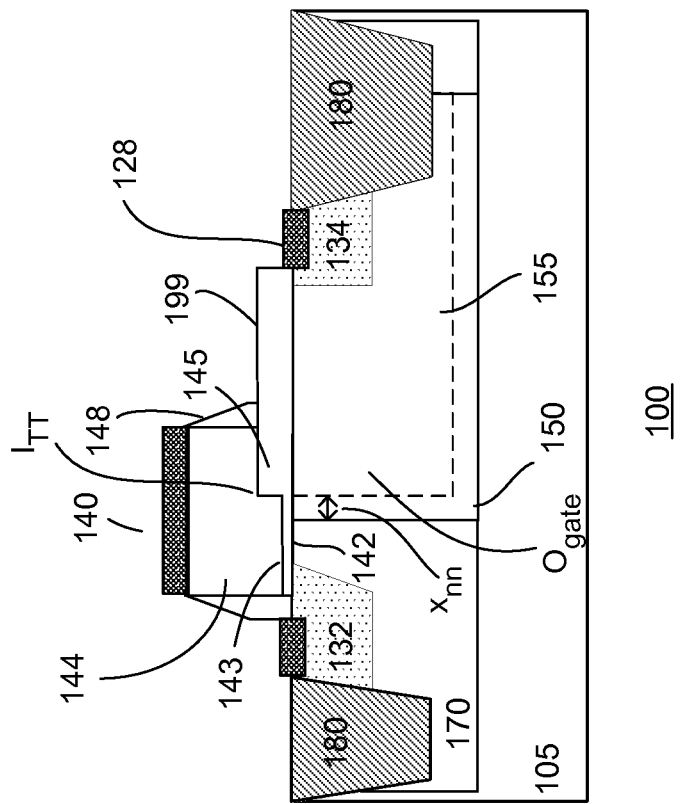

In yet some other embodiments, a deep device well 160 may be disposed in the substrate, as shown in FIG. 1c. The deep device well is doped with first polarity type dopants. In one embodiment, the deep device well is intermediately doped with first polarity type dopants. For example, the deep device well has a first polarity type dopant concentration of about $1E12$-$1E14/cm^2$. Other dopant concentrations may also be useful. The deep device well, for example, is disposed within the device isolation region. The deep device well has a depth greater than the drift and second device wells. For example, the deep device well encompasses the source, drain, device well and drift well. The deep device well, for example, may be about 0.5-10 μm deep. Providing a deep device well at other depths may also be useful. The deep device well serves to isolate the second device well or body from the substrate.

In the case where a deep device well is provided, the first and second device wells need not be contiguous. For example, as shown, a gap is provided between the second device well and drift well. However, since the drift well and the deep device well are of the same polarity type, this effectively extends the drift well to the second device well. Providing no gap between the first and second device wells may also be useful.

Salicide contacts 128 may be formed on the gate electrode of the gate and source and drain regions. The salicide contacts, for example, may be nickel-based contacts. Other types of metal salicide contacts may also be useful. For example, the salicide contact may be cobalt silicide (CoSi). The salicide contacts may be about 50-300 Å thick. Other thickness of salicide contacts may also be useful. The salicide contacts may be employed to reduce contact resistance and facilitate contact to the back-end-of-line metal interconnects.

In some embodiments, no internal isolation region is provided. For example, as shown in FIG. 1d, the transistor of FIG. 1a is not provided with an internal isolation region. Providing no internal isolation region may also be extended to embodiments of FIGS. 1b-c. In the case where no internal isolation region is provided, a salicide block 199 may be provided to prevent salicidation of the substrate between the gate and drain region. For example, the salicide block prevents salicidation of the substrate in the drift region. This, for example, provides a high resistance drift region to sustain high voltage applied to the drain.

In one embodiment, the salicide block may be aligned with the edge of the gate and drain region. In one embodiment, the salicide block may be aligned with the edge of the gate and slightly overlaps the drain. The overlap may be, for example, about 0.1-0.5 μm. The salicide block, for example, is formed from a material of which silicidation does not occur. In one embodiment, the salicide block is formed of a dielectric material. The dielectric material, for example, may be oxide, nitride, oxynitride or a combination thereof. Other types of dielectric materials, such as those compatible for semiconductor processing, may also be useful. The salicide block may be about 300-1000 Å thick. Other thicknesses of salicide block may also be useful.

In one embodiment, the salicide block is an extension of the second portion of the gate dielectric. For example, the salicide block and the second portion of the gate dielectric are formed of same dielectric materials and have same thickness over the substrate. However, it is understood that the salicide block and the second portion of the gate dielectric may have different thicknesses.

Providing salicide blocks to prevent salicidation is described in co-pending U.S. patent application Ser. No. 13/189,573, which is herein incorporated by reference for all purposes. The salicide block may be subsequently removed or remain after formation of the salicide contacts.

Figure 2A:
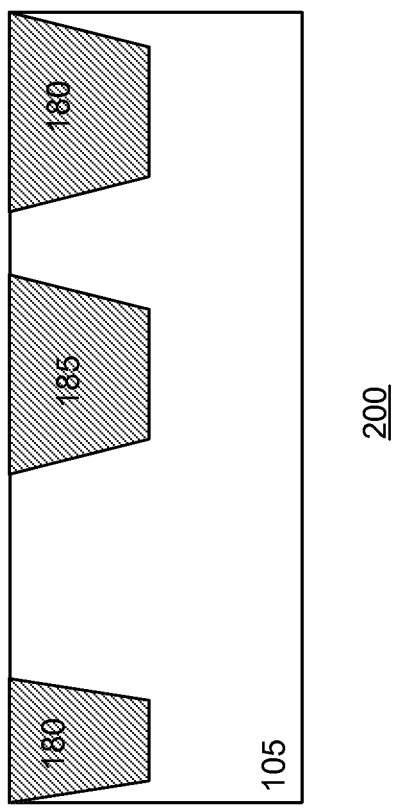

FIGS. 2a-h show cross-sectional views of an embodiment of a process for forming a device 200. Referring to FIG. 2a, a substrate 105 is provided. The substrate, in one embodiment, is a silicon substrate. The substrate may be a doped substrate, such as a $p^-$ substrate. Other types of substrates, such as a germanium-based, gallium arsenide, COI such as SOI, or sapphire, may also be useful. The substrates may be doped with other types of dopants or dopant concentrations.

In some embodiment, the substrate may include a base substrate with a surface substrate disposed thereon. The base and surface substrates may be, for example, silicon. In one embodiment, the surface substrate is an epi surface substrate. Other types of semiconductor materials for the base and surface substrates may also be useful. It is understood that the base and surface substrates need not be the same material.

In one embodiment, the base substrate is a $p^+$ substrate and the surface substrate is a $p^-$ substrate. Providing substrates with other dopant concentrations or different types of dopants, including no dopants, may also be useful. In some embodiments, a buried well of the opposite polarity as the surface substrate may be provided. The buried well, for example, may be a heavily doped well of the opposite polarity as the surface substrate. In one embodiment, a $n^+$ buried well is to separate the p− surface epi substrate from a p− base substrate. The $n^+$ buried well may be a part of the base substrate. Other configurations of base substrate, surface substrate and buried well may also be useful.

As shown, a device region is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

In one embodiment, the device region is a HV region. The device region, for example, serves as a device region for a LD transistor. Providing a device region for other types of devices may also be useful. The device region is separated from other regions by a device isolation region 180. The device isolation region surrounds the device region. In one embodiment, the device region also includes an internal device isolation region to separate the device region into first and second device sub-regions. For example, the internal device isolation region separates the device region into first and second sub-regions on the surface of the substrate.

In one embodiment, an internal isolation region 185 is provided within the device region. The internal isolation region, for example, is disposed in the device region along a channel width direction of the transistor between the gate and drain. The internal isolation, for example, extends from one side to the other side of the device region along the channel length direction.

The isolation regions are, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful. In other embodiments, the isolation may be other types of isolation regions. Also, the device and internal isolation regions may be different types of isolation regions.

As shown in FIG. 2b, a first device well 150 and a secondary portion 140 are formed in the device region. The first device well serves as a drift well for the device. In one embodiment, the drift well is disposed in a portion of the device region. The drift well, for example, encompasses the internal isolation region and a portion of the device isolation region on a second side of the device region. The depth of the drift well, for example, may be about 0.5-5 μm. Providing a drift well of other depths may also be useful. The depth of the drift well, for example, may depend on the design requirements. The drift well includes first polarity type dopants for a first polarity type device. For example, a n-type drift well is provided for a n-type device. The n-type drift well, for example, may include phosphorus dopants. Forming a p-type drift well for a p-type device may also be useful. In one embodiment, the drift well may be lightly or intermediately doped with first polarity type dopants. Other dopant concentration for the first drift well may also be useful.

The secondary portion is disposed in the drift well. In one embodiment, the depth of the secondary portion is shallower than a depth of the drift well. Providing the secondary portion having other depths may also be useful. For example, the depth of the secondary portion may be equal to about the depth of the drift well or deeper than the drift well. The depth of the secondary portion should be sufficient to cause the gate dielectric over it to have enhanced growth rate.

The secondary portion of the drift well enhances or increases oxide growth rate on the substrate surface over it as compared to the portion or portions without the neutral dopants. Due to the neutral dopants, the enhanced growth rate is achieved without negatively impacting the semiconductor behavior of the drift well. Neutral dopants, for example, may include fluorine (F), chlorine (Cl), germanium (Ge) or silicon (Si). Other types of neutral dopants or a combination of neutral dopants may also be useful. The secondary portion should contain a sufficient dopant concentration of neutral dopants to increase oxide growth rate. The higher the dopant concentration, the greater the enhancement in growth rate. In one embodiment, the dopant concentration of neutral dopants in the secondary portion is about $1E14$-$1E16/cm^2$. Other dopant concentrations for the secondary portion may also be useful.

To form the drift well, an implant mask 282 which exposes the device region is used. The implant mask, for example, is a photoresist layer patterned by a lithographic mask. The implant, for example, includes implanting first polarity type dopants into the substrate. In one embodiment, forming the drift well includes performing an angled implant. The angle of the implant, for example, is about 15-45° with respect to a plane of the edge of the implant mask in a direction towards the source. The angled implant results in a doped region underneath the implant mask, as shown in FIG. 2b.

In one embodiment, the implant mask is also used to form the secondary portion 155 in the drift well. The secondary portion is formed with an implant. The implant, for example, includes implanting neutral dopants at an angle which is perpendicular to the surface of the substrate. That is implant angle is equal to 0°. The implant dose, for example, is about $1E14$-$1E16$ ions/$cm^2$. The implant, for example, results in a first edge of the secondary portion which is offset from the inner edge of the drift well, leaving at least a portion without neutral dopants $X_{nn}$ in the drift well. After forming the drift well and secondary portion, the implant mask is removed.

Figure 2C:
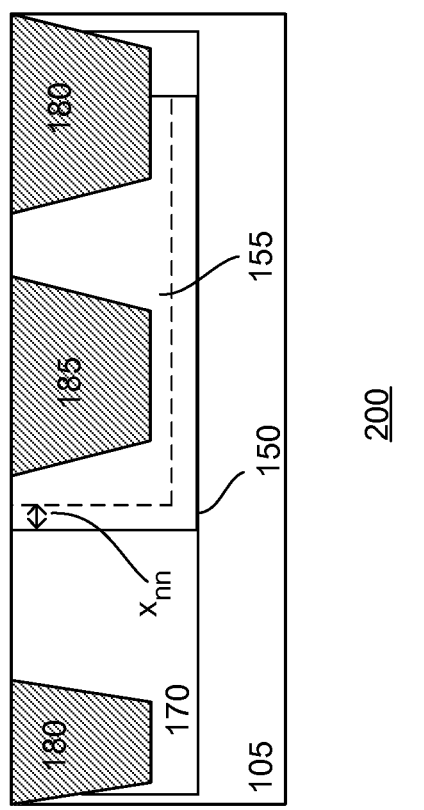

A second device well 170 is formed in the device region, as shown in FIG. 2c. The second device well is disposed within the device isolation region. The second device well serves as a body well for the transistor. For example, the second device well serves to form the channel of the transistor between the source and drift well. The second device well includes second polarity type dopants. In one embodiment, the second device well is a lightly doped device well. For example, the dopant concentration of the device well is about $1E12$-$1E14/cm^2$. In other embodiments, the second device well may be at about the same depth as the drift well. For example, the second device well may be on both sides of the drift well. Providing a second device well at other depths may also be useful. In one embodiment, the depth or bottom of the second device well is below the source, drain and drift well. For example, the device well encompasses the source, drain, drift well and internal device isolation region. In one embodiment, the depth or bottom of the device well is below the device isolation region and internal device isolation region. Other configurations of the device and drift well may also be useful.

To form the second device well, an implant mask which exposes the device region is used. The implant mask, for example, comprises photoresist patterned by a lithographic mask. Dopants are implanted into the substrate using the implant mask. The dopants are implanted with the appropriate dose and power. In one embodiment, the device well is formed prior to forming the drift well.

The implant processes used to form the device wells may be compatible or the same as processes used to form other similar types of wells in the device. For example, the processes may be compatible with those used in current CMOS processes for forming similar types of wells. For example, the device well may be formed at the same time as the low voltage device or intermediate voltage device well. This allows the same lithographic mask of the current CMOS implant mask to be used to pattern the implant mask for the device well. For example, the current CMOS implant mask may be customized to include the device well opening. In other embodiments, a separate device well mask may be used to specifically tailor for the doping of the device well. In such cases, the same mask can also be used to form a second device well.

An anneal is performed. In one embodiment, the anneal is performed after the drift well, secondary portion and second device well are formed. The anneal activates the dopants. In other embodiments, separate anneals may be performed for the drift and device wells. For example, an anneal may be performed after forming a device well.

Figure 2D:
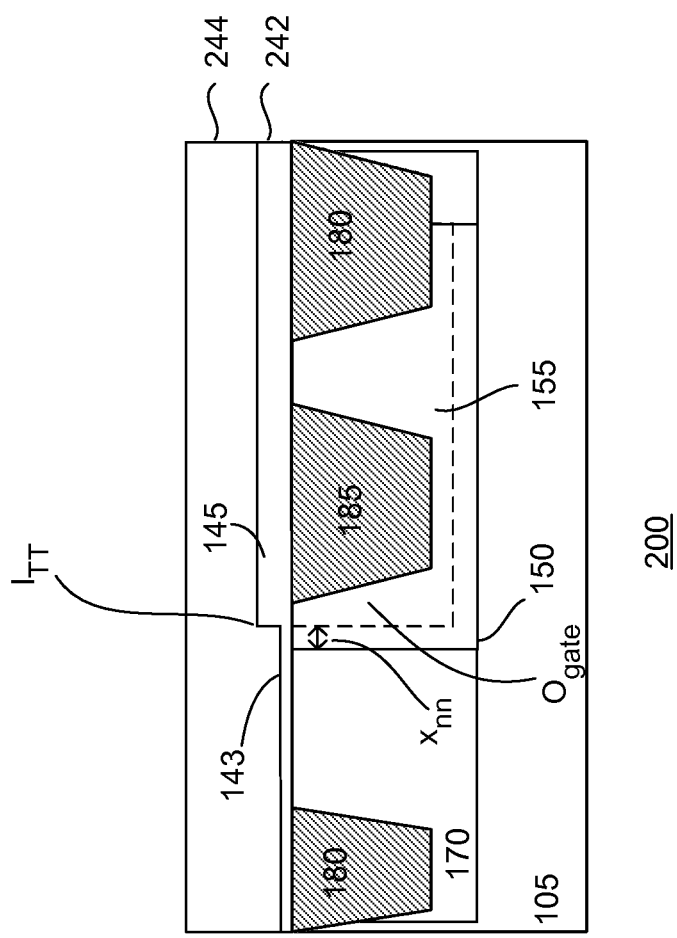

As shown in FIG. 2d, gate layers of a gate are formed on the substrate. In one embodiment, the gate layers include a gate dielectric layer 242 on the substrate and a gate electrode layer 244 thereon. The gate dielectric layer, for example, is silicon oxide. Other types of gate dielectric, for example, high voltage gate dielectric, may also be useful. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing can be, for example, performed at a temperature of about 600-1000° C. Forming other types of gate dielectric layers or using other processes may also be useful.

In one embodiment, the gate dielectric layer is a hybrid gate dielectric having first and second portions 143 and 145 along a width direction of the gate. The width direction is from the source side of the gate to the drain side. For example, the first portion of the hybrid gate dielectric has a first thickness $T_1$ and the second portion of the hybrid gate dielectric has a second thickness $T_2$. In one embodiment, the first thickness is smaller than the second thickness. The first and second portions form an interface $I_{TT}$. In one embodiment, the first portion is adjacent to the source and the second portion is adjacent to the drain. For example, the gate dielectric portion adjacent to the source is thinner than the gate dielectric portion adjacent to the drain (e.g., $T_1<T_2$). For example, the first thickness may be 50-500 Å, while the second thickness maybe 100-1000 Å.

In one embodiment, the gate electrode layer is a silicon layer. The silicon layer, for example, may be a polysilicon layer. The gate electrode layer, for example, is a conformal layer, following the profile of the gate dielectric layer. The gate electrode layer may be optionally planarized to form a planar top surface. For example, a chemical mechanical polish (CMP) may be performed to planarize the gate electrode. The thickness of the gate electrode layer may be about 700-5000 Å. Other thickness may also be useful. The gate electrode layer may be formed by, for example, CVD. Other techniques for forming the gate electrode layer may also be useful. The gate electrode layer can be formed as an amorphous or non-amorphous layer. In the case of an amorphous layer, an anneal may be performed to form a polycrystalline silicon layer.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

Figure 2E:
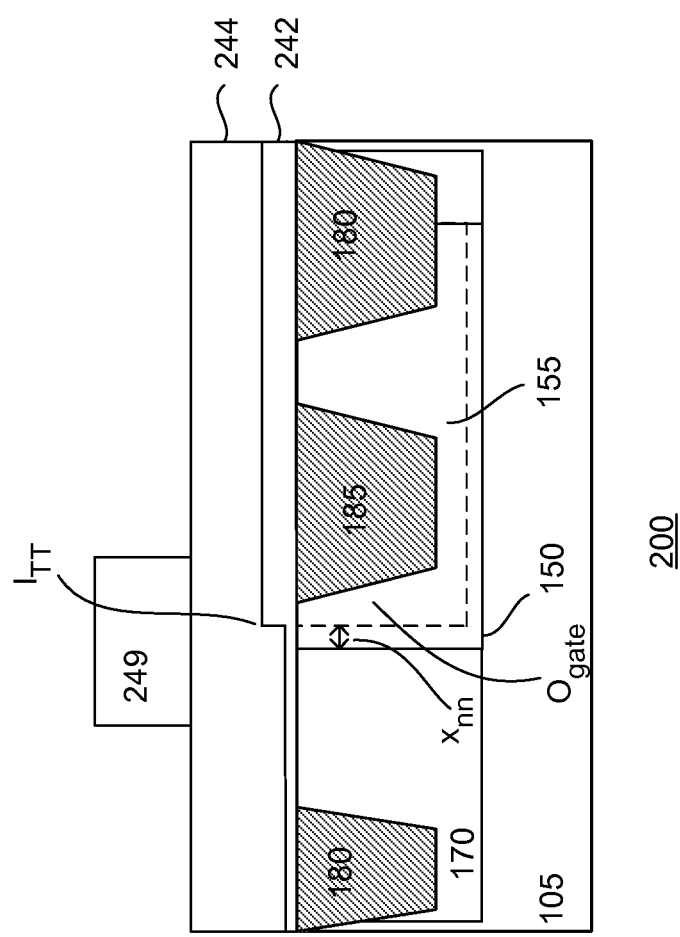

Referring to FIG. 2e, a mask layer 249 is formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to locations when the gate layers are to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

Figure 2F:
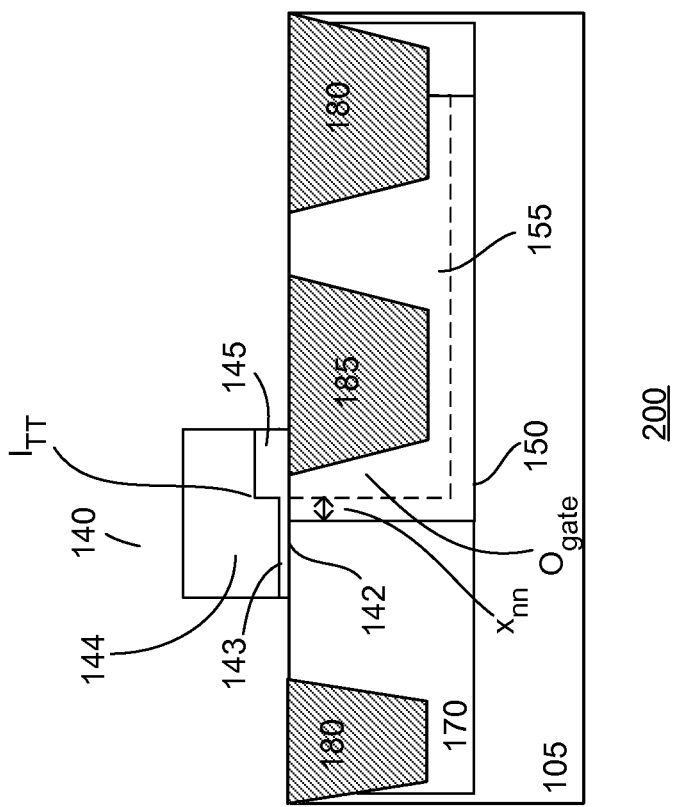

The patterned mask layer serves as an etch mask for a subsequent etch process, as shown in FIG. 2f. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form a gate 140. The gate, in one embodiment, overlaps the drift well, forming an overlap $O_{gate}$ region. The gate, for example, may be a gate conductor which serves as a common gate for multiple transistors. Other configurations of the gate may also be useful.

Figure 2G:
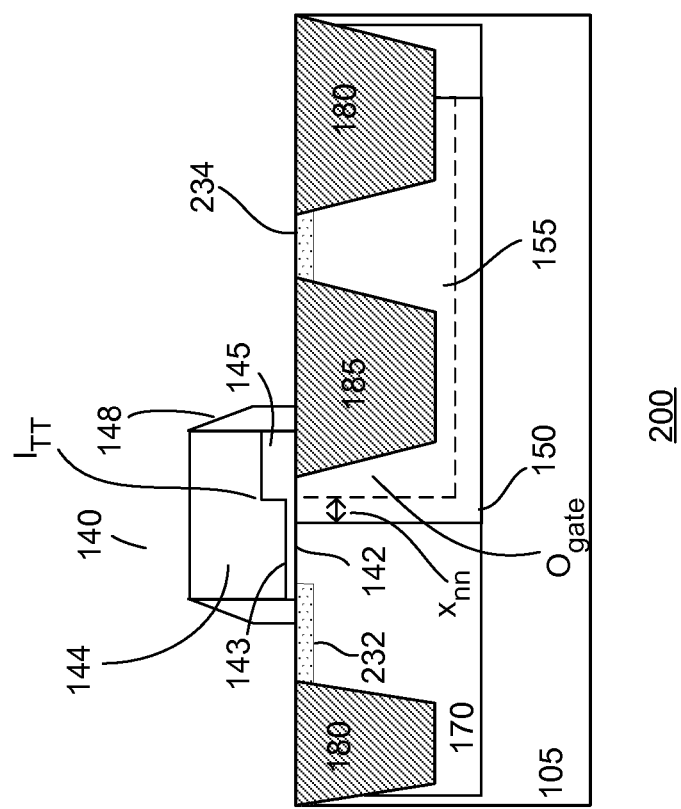

In one embodiment, lightly doped region 232 is formed in the substrate in the source region of the device, as shown in FIG. 2g. The lightly doped region has first polarity type dopants. To form the lightly doped region, first polarity type dopants are implanted into the substrate. The implant, for example, may be self-aligned with respect to the device region. For example, the implant may dope the substrate unprotected by the gate and isolation region. The depth of the lightly doped regions, for example, is about 0.1-0.4 µm. The implant dose may be about $5E12-5E13/cm^2$ and the implant energy may be about 10-100 KeV. Other implant parameters may also be useful. In one embodiment, forming the lightly doped region in the source region also forms a lightly doped region 234 in the drain region. The implant that forms the lightly doped regions may be self-aligned with respect to the device region. For example, an implant mask which exposes the device region may be provided. The gate and isolation regions provide self-alignment in the device region. The implant mask may be a photoresist layer. Other types of implant masks may also be useful.

Sidewall spacers 148 may be formed on the sidewalls of the gates. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

Figure 2H:
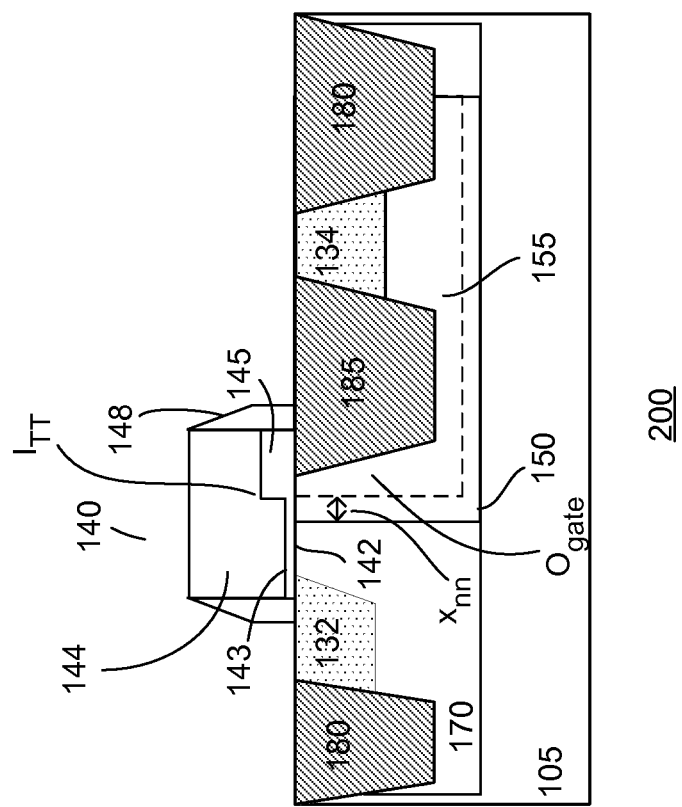

Referring to FIG. 2h, heavily doped regions 132 and 134 are formed in the source and drain regions on the substrate. The heavily doped regions have first polarity type dopants. Forming the heavily doped regions includes implanting first polarity type dopants into the substrate. The implant, like the one that forms the lightly doped regions, is self-aligned with respect to the device region. For example, the dopants may be doped into the substrate unprotected by the gate and isolation regions. In this case, the sidewall spacers cause the heavily doped source region to be offset, creating a source which includes a lightly doped source portion and a heavily doped deeper portion. The depth of the heavily doped regions, for example, is about 0.1-0.4 µm. The implant dose may be about $1E15-1E16/cm^2$ and the implant energy may be about 10-100 KeV. Other implant parameters may also be useful.

Figure 2I:
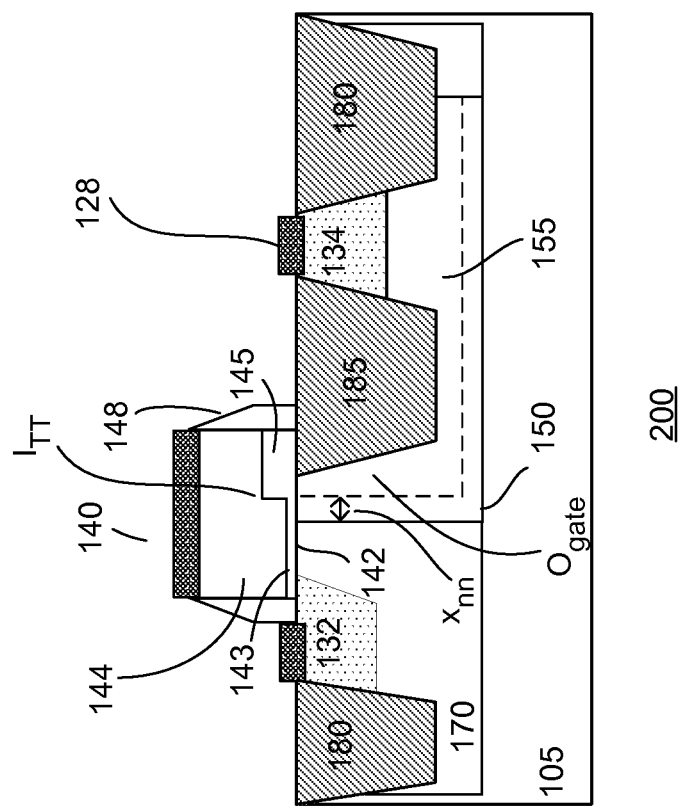

In one embodiment, salicide contacts 128 are formed on contact regions of the transistor as shown in FIG. 2i. For example, the salicide contacts are formed on the gate and source and drain of the transistor. The salicide contacts are to facilitate low resistance contacts between the active substrate and the BEOL metal lines. In one embodiment, the thickness of the salicide contacts is about 50-300 Å. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or be formed by other types of processes can also be useful.

A first anneal may be performed. The first anneal diffuses the metal dopants into the active substrate, forming a silicided layer. The first anneal, for example, is performed at a temperature of about 500° C. for about 30 seconds. Excess metal not used in the silicidation of the active surface is removed by, for example, a wet removal process. For example, unreacted metal material is removed selective to the salicide contacts. A second anneal may be performed to enhance the material properties of the silicided layer, for example, lower resistivity. The first and second annealing processes may be a rapid thermal anneal (RTA). Other annealing parameters or techniques may also be useful to form the salicide contacts.

The process continues to form the device. The process may include forming a PMD layer and contacts to the terminals of the transistor as well as one or more interconnect levels, final passivation, dicing, assembly and packaging. Other processes may also be included. For example, other components, such as low voltage, medium voltage, and high voltage I/O devices can be formed prior to forming the interconnections.

FIGS. 3a-j show cross-sectional views of an embodiment of a process for forming another device 300. The process may contain similar elements or process steps as the process described in FIGS. 2a-i. As such, the common elements or process steps may not be described or described in detail.

In one embodiment, a device isolation region 180 is formed on the substrate, as shown in FIG. 3a. The isolation regions are, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful. In other embodiments, the isolation may be other types of isolation regions. Also, the device and internal isolation regions may be different types of isolation regions.

Figure 3B:
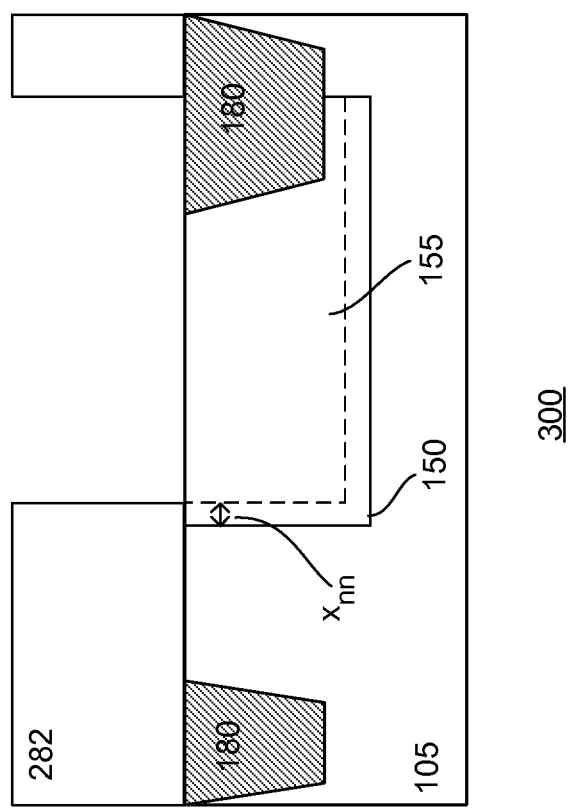
Figure 3C:
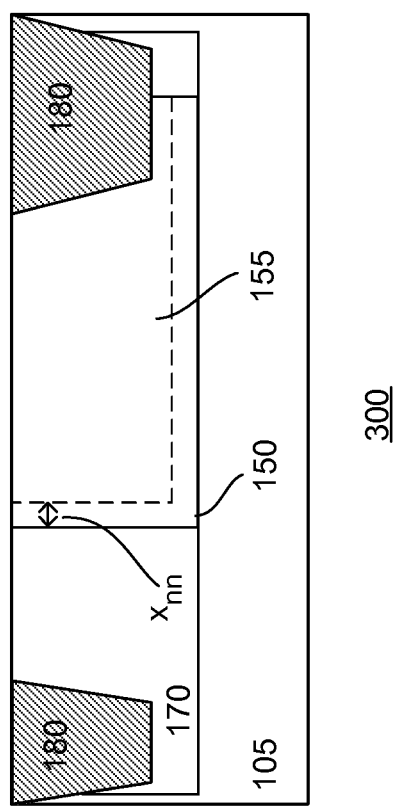

As shown in FIG. 3b, a first device well 150 and a secondary portion 155 are formed in the device region. The first device well serves as a drift well for the device. In one embodiment, the drift well is disposed in a portion of the device region. The drift well, for example, encompasses the internal isolation region and a portion of the device isolation region on a second side of the device region. The depth of the drift well, for example, may be about 0.5-5 µm. Providing a drift well of other depths may also be useful. The depth of the drift well, for example, may depend on the design requirements. The drift well includes first polarity type dopants for a first polarity type device. For example, a n-type drift well is provided for a n-type device. The n-type drift well, for example, may include phosphorus dopants. Forming a p-type drift well for a p-type device may also be useful. In one embodiment, the drift well may be lightly or intermediately doped with first polarity type dopants. Other dopant concentration for the first drift well may also be useful.

The secondary portion is disposed in the drift well. In one embodiment, the depth of the secondary portion is shallower than a depth of the drift well. Providing the secondary portion having other depths may also be useful. For example, the depth of the secondary portion may be equal to about the depth of the drift well or deeper than the drift well. The depth of the secondary portion should be sufficient to cause the gate dielectric over it to have enhanced growth rate.

The secondary portion of the drift well enhances or increases oxide growth rate on the substrate surface over it as compared to the portion or portions without neutral dopants. Due to the neutral dopants, the enhanced growth rate is achieved without negatively impacting the semiconductor behavior of the drift well. Neutral dopants, for example, may include fluorine (F), chlorine (Cl), germanium (Ge) or silicon (Si). Other types of neutral dopants or a combination of neutral dopants may also be useful. The secondary portion should contain a sufficient dopant concentration of neutral dopants to increase oxide growth rate. The higher the dopant concentration, the greater the enhancement in growth rate. In one embodiment, the dopant concentration of neutral dopants in the secondary portion is about $1E14$-$1E16/cm^2$. Other dopant concentrations for the secondary portion may also be useful.

To form the drift well, an implant mask 282 which exposes the device region is used. The implant mask, for example, is a photoresist layer patterned by a lithographic mask. The implant, for example, includes implanting first polarity type dopants into the substrate. In one embodiment, forming the drift well includes performing an angled implant. The angle of the implant, for example, is about 15-45° with respect to a plane of the edge of the implant mask in a direction towards the source. The angled implant results in a doped region underneath the implant mask, as shown in FIG. 3b.

In one embodiment, the implant mask is also used to form the secondary portion 155 in the drift well. The secondary portion is formed with an implant. The implant, for example, includes implanting neutral dopants at an angle which is perpendicular to the surface of the substrate. That is implant angle is equal to 0°. The implant dose, for example, is about $1E14$-$1E16$ ions/$cm^2$. The implant, for example, results in a first edge of the secondary portion which is offset from the inner edge of the drift well, leaving at least a portion without neutral dopants $X_{nn}$ in the drift well. After forming the drift well and secondary portion, the implant mask is removed.

A second device well 170 is formed in the device region, as shown in FIG. 2c. The second device well is disposed within the device isolation region. The second device well serves as a body well for the transistor. For example, the second device well serves to form the channel of the transistor between the source and drift well. The second device well includes second polarity type dopants. In one embodiment, the second device well is a lightly doped device well. For example, the dopant concentration of the device well is about $1E12$-$1E14/cm^2$. In other embodiments, the second device well may be at about the same depth as the drift well. For example, the second device well may be on both sides of the drift well. Providing a second device well at other depths may also be useful. In one embodiment, the depth or bottom of the second device well is below the source, drain and drift well. For example, the device well encompasses the source, drain, drift well and internal device isolation region. In one embodiment, the depth or bottom of the device well is below the device isolation region and internal device isolation region. Other configurations of the device and drift well may also be useful.

To form the second device well, an implant mask which exposes the device region is used. The implant mask, for example, comprises photoresist patterned by a lithographic mask. Dopants are implanted into the substrate using the implant mask. The dopants are implanted with the appropriate dose and power. In one embodiment, the second device well is formed prior to forming the drift well.

The implant processes used to form the device wells may be compatible or the same as processes used to form other similar types of wells in the device. For example, the processes may be compatible with those used in current CMOS processes for forming similar types of wells. For example, the device well may be formed at the same time as the low voltage device or intermediate voltage device well. This allows the same lithographic mask of the current CMOS implant mask to be used to pattern the implant mask for the device well. For example, the current CMOS implant mask may be customized to include the device well opening. In other embodiments, a separate device well mask may be used to specifically tailor for the doping of the device well. In such cases, the same mask can also be used to form a second device well.

An anneal is performed. In one embodiment, the anneal is performed after the drift well, secondary portion and device wells are formed. The anneal activates the dopants. In other embodiments, separate anneals may be performed for the drift and device wells. For example, an anneal may be performed after forming a device well.

Figure 3D:
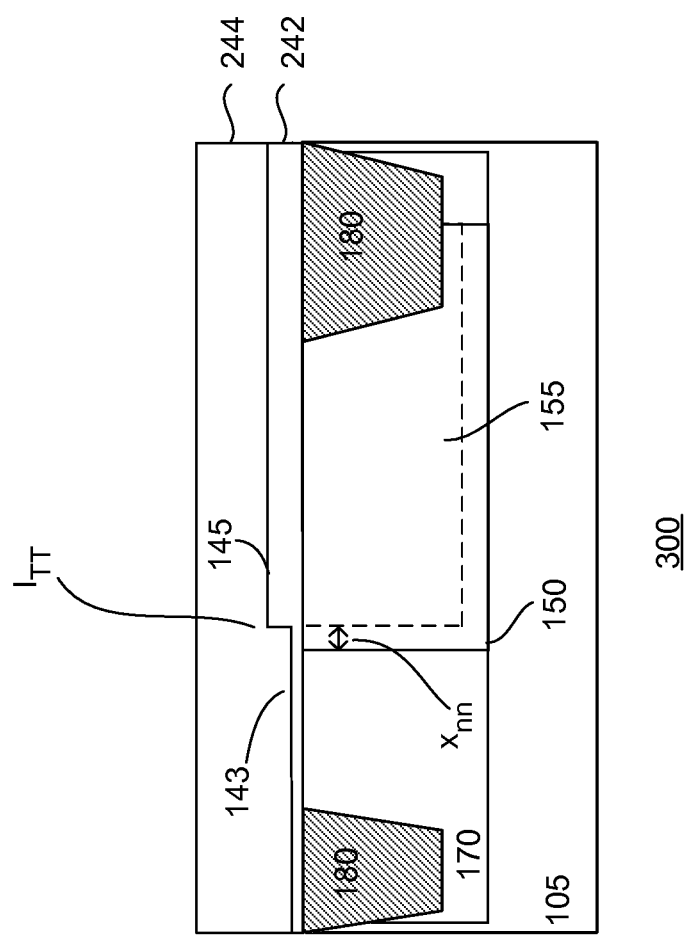

As shown in FIG. 3d, gate layers of a gate are formed on the substrate. In one embodiment, the gate layers include a gate dielectric layer 242 on the substrate and a gate electrode layer 244 thereon. The gate dielectric layer, for example, is silicon oxide. Other types of gate dielectric, for example, high voltage gate dielectric, may also be useful. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing can be, for example, performed at a temperature of about 600-1000° C. Forming other types of gate dielectric layers or using other processes may also be useful.

In one embodiment, the gate dielectric layer is a hybrid gate dielectric having first and second portions 143 and 145 along a width direction of the gate. The width direction is from the source side of the gate to the drain side. For example, the first portion of the hybrid gate dielectric has a first thickness $T_1$ and the second portion of the hybrid gate dielectric has a second thickness $T_2$. In one embodiment, the first thickness is smaller than the second thickness. The first and second portions form an interface $I_{TT}$. In one embodiment, the first portion is adjacent to the source and the second portion is adjacent to the drain. For example, the gate dielectric portion adjacent to the source is thinner than the gate dielectric portion adjacent to the drain (e.g., $T_1<T_2$). For example, the first thickness may be 50-500 Å, while the second thickness maybe 100-1000 Å. It is understood that the thickness profile of the gate dielectric layer on the secondary portion may be different from the thickness profile of the gate dielectric layer on the surface of the isolation regions. For example, the thickness profile of the second portion of the gate dielectric layer may be a step profile. The planar thickness profile of the second portion shown in FIG. 3d is a simplified illustration to emphasize the different thickness profiles of the first and second portions of the gate dielectric layer.

In one embodiment, the gate electrode layer is a silicon layer. The silicon layer, for example, may be a polysilicon layer. The thickness of the gate electrode layer may be about 700-5000 Å. Other thickness may also be useful. The gate electrode layer may be formed by, for example, CVD. Other techniques for forming the gate electrode layer may also be useful. The gate electrode layer can be formed as an amorphous or non-amorphous layer. In the case of an amorphous layer, an anneal may be performed to form a polycrystalline silicon layer. It is understood that the thickness profile of the gate electrode layer may adopt the thickness profile of the gate dielectric layer. The planar thickness profile shown in FIG. 2d is a simplified illustration.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

Figure 3E:
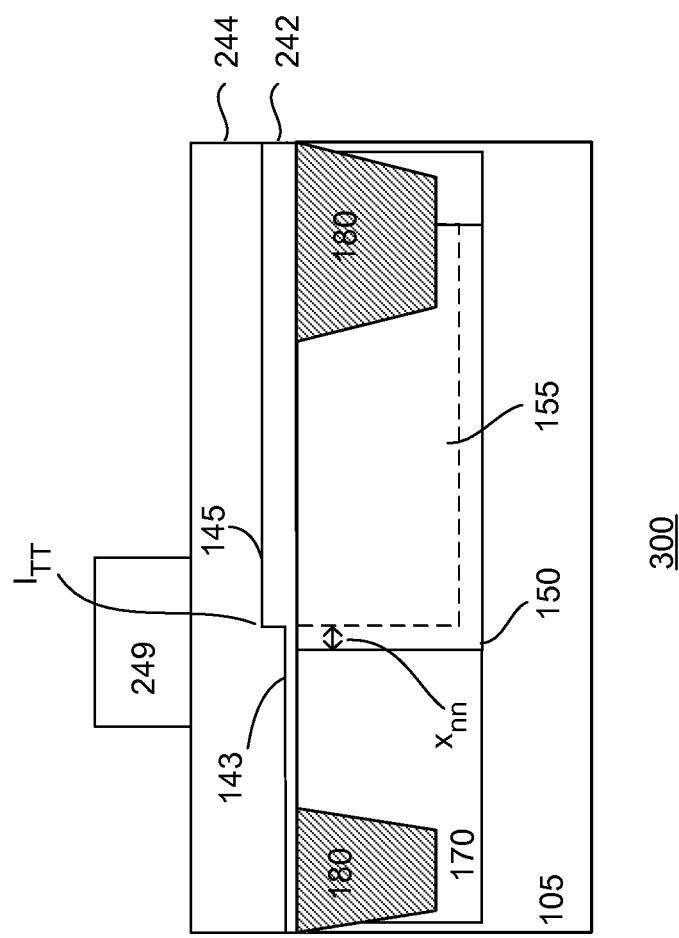

Referring to FIG. 3e, a first mask layer 249 is formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to locations when the gate electrode layer is to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

The patterned first mask layer serves as an etch mask for a subsequent etch process. For example, the etch transfers the pattern of the mask to the gate electrode layer. The etch selectively removes the gate electrode layer unprotected by the mask, exposing the gate dielectric layer. The etch, for example, may be an anisotropic etch, such as reactive ion etch (RIE). Other types of etch processes may also be useful. After the removal of the unprotected gate electrode layer, the patterned mask layer is removed, for example, by wet etch. Other techniques for removing the patterned mask layer may also be useful.

Figure 3F:
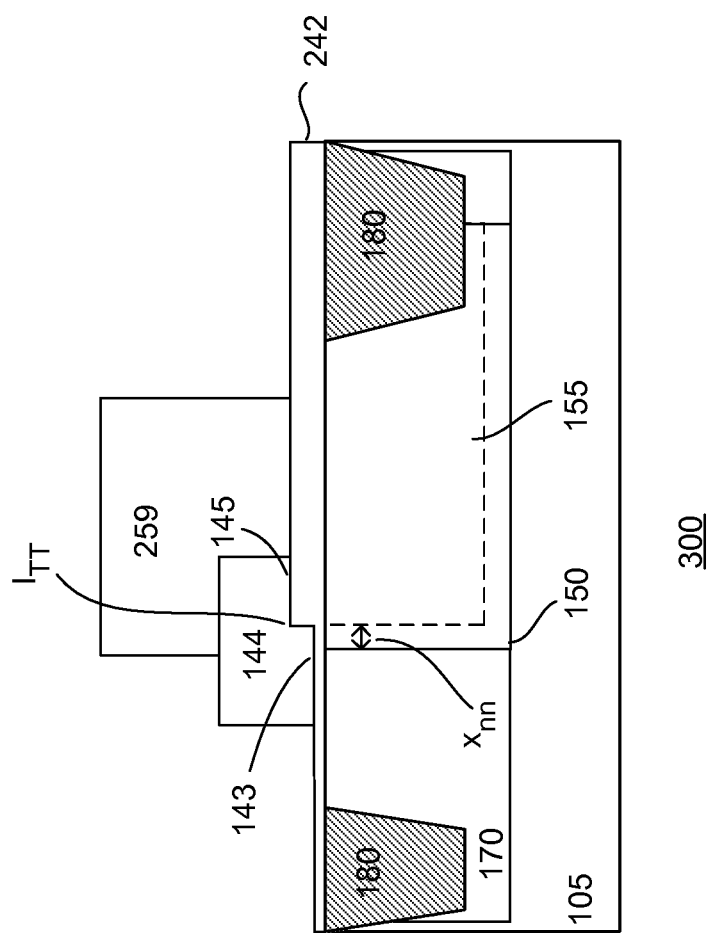

Referring to FIG. 3f, a second mask layer 259 is formed on the substrate. In one embodiment, the mask layer is a soft mask layer, such as a photoresist layer. An exposure source may selectively expose the photoresist layer through a reticle containing the desired pattern. After selectively exposing the photoresist layer, it is developed to form opening corresponding to locations when the gate dielectric layer is to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

Figure 3G:
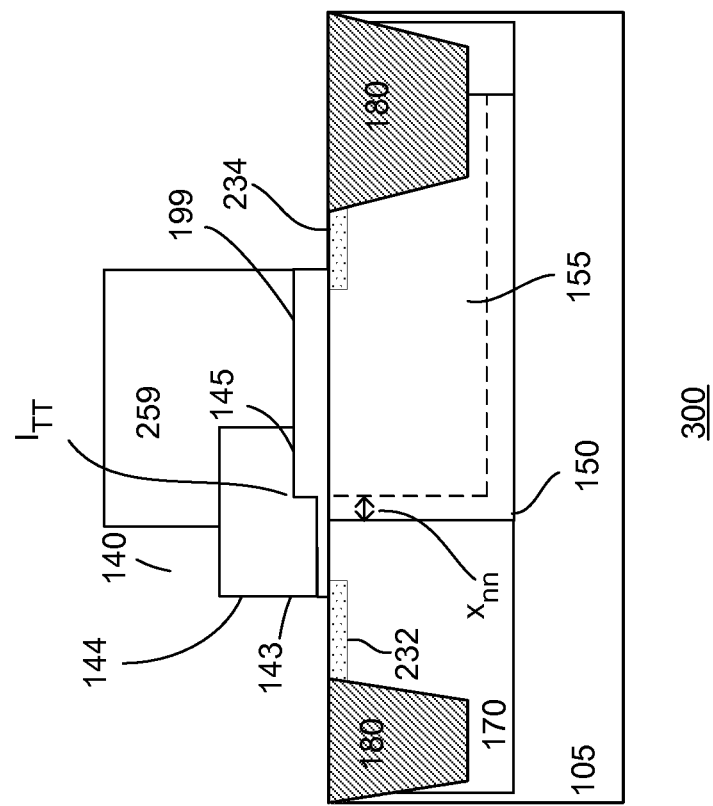

The patterned second mask layer serves as an etch mask for a subsequent etch process, as shown in FIG. 3g. For example, the etch transfers the pattern of the mask to the gate dielectric layer. The etch selectively removes the gate dielectric layer unprotected by the mask, forming a gate 140 having a gate electrode 144 and a gate dielectric 142. The etch, for example, may be an anisotropic etch, such as reactive ion etch (RIE). Other types of etch processes may also be useful.

In one embodiment, forming the gate also forms a salicide block layer 199 on the substrate adjacent to the drain. The salicide block layer prevents formation of salicide contacts on the substrate. In one embodiment, the salicide block layer is a dielectric layer. For example, the salicide block layer may be oxide, nitride, oxynitride or a combination thereof. Other types of dielectric materials or block materials, such as those compatible for semiconductor processing, may also be useful. In one embodiment, the salicide block is an extension of the second portion of the gate dielectric. For example, the salicide block and the second portion of the gate dielectric are formed of same dielectric materials and have same thickness over the drift well. However, it is understood that the salicide block and the second portion of the gate dielectric may have different thicknesses.

In one embodiment, the salicide block slightly overlaps the drain region. The overlap may be, for example, about 0.1-0.5 μm. This overlap may be due to alignment or processing margins to provide reliable process window. However, it is understood that the salicide block may also be aligned with the edge of the drain region.

Figure 3H:
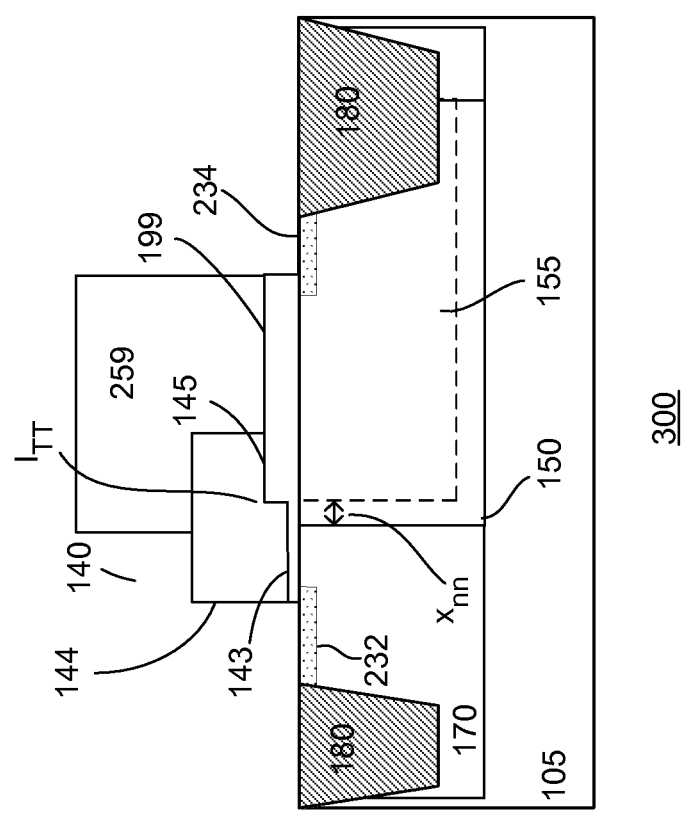

The process continues to form lightly doped regions 232 and 234 in the substrate in the source and drain regions of the device, as shown in FIG. 3h. The lightly doped regions have first polarity type dopants. To form the lightly doped regions, first polarity type dopants are implanted into the substrate. The implant, for example, may be self-aligned with respect to the device region on the source side and assisted by the implant mask 259 on the drain side. For example, the implant may dope the substrate unprotected by the gate and the implant mask. The depth of the lightly doped regions, for example, is about 0.1-0.4 μm. The implant dose may be about $5E12$-$5E13/cm^2$ and the implant energy may be about 10-100 KeV. Other implant parameters may also be useful. In an alternatively embodiment, the gate electrode may be fully protected by the implant mask to prevent doping of the gate. After forming the lightly doped regions, the patterned mask is removed by, for example, a wet etch. Other techniques for removing the patterned mask may also be useful.

Figure 3I:
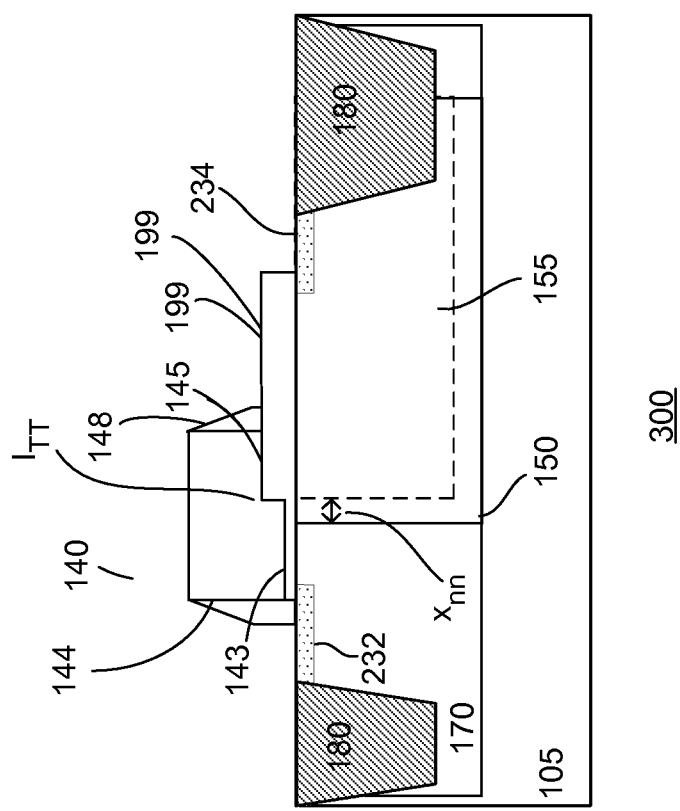

Sidewall spacers 148 may be formed on the sidewalls of the gates, as shown in FIG. 3i. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

Figure 3J:
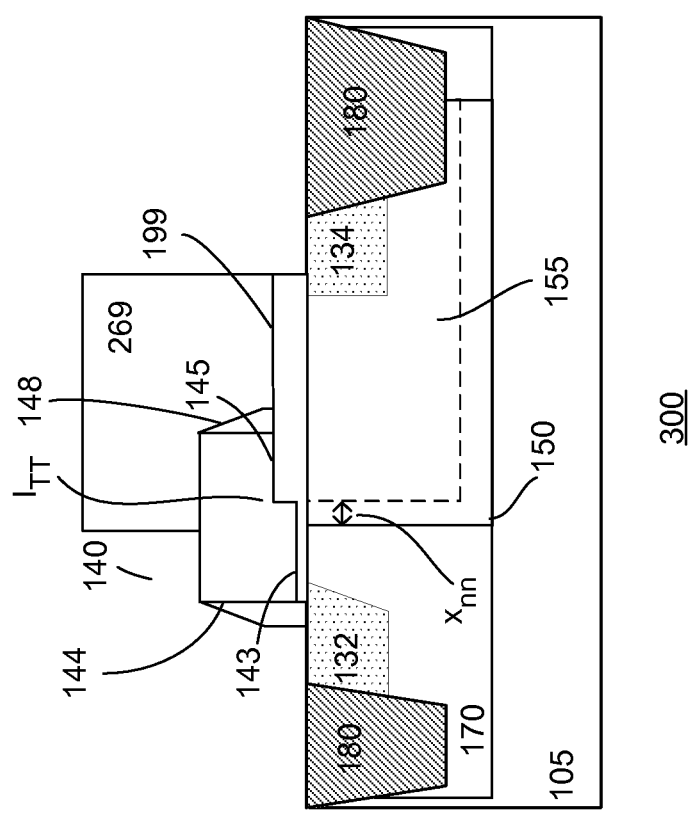

Referring to FIG. 3j, heavily doped regions 132 and 134 are formed in the source and drain regions on the substrate. The heavily doped regions have first polarity type dopants. Forming the heavily doped regions includes implanting first polarity type dopants into the substrate. An implant mask 269, such as photoresist, may be used. For example, the implant may dope the substrate unprotected by the sidewall spacer and the implant mask. In this case, the sidewall spacer causes the heavily doped source region to be offset, creating a source which includes a lightly doped portion and a heavily doped deeper portion. The depth of the lightly doped region, for example, may be about 0.1-0.4 μm. The implant dose may be about $5E12-5E13/cm^2$ and the implant energy may be 10-100 KeV. Other implant parameters may also be useful. After the forming the heavily doped regions, the implant mask is removed, for example, by wet etch.

Figure 3K:
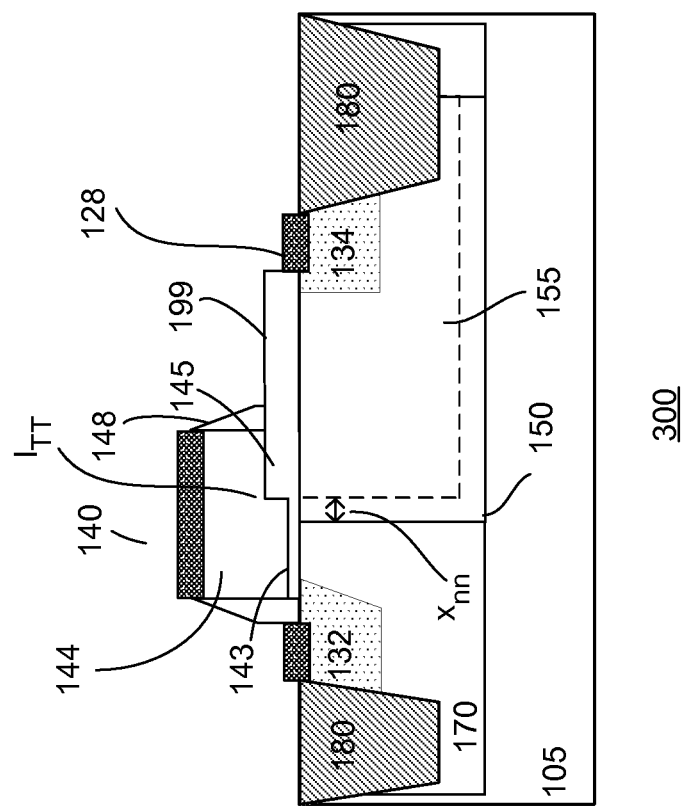

In one embodiment, salicide contacts 128 are formed on contact regions of the transistor as shown in FIG. 3k. For example, the salicide contacts are formed on the gate and source and drain of the transistor. The salicide contacts are to facilitate low resistance contacts between the active substrate and the BEOL metal lines. In one embodiment, the thickness of the salicide contacts is about 50-300 Å. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or formed by other types of processes can also be useful.

A first anneal may be performed. The first anneal diffuses the metal dopants into the active substrate, forming a silicided layer. The first anneal, for example, is performed at a temperature of about 500° C. for about 30 seconds. Excess metal not used in the silicidation of the active surface is removed by, for example, a wet removal process. For example, unreacted metal material is removed selective to the salicide contacts. A second anneal may be performed to enhance the material properties of the silicided layer, for example, lower resistivity. The first and second annealing processes may be a rapid thermal anneal (RTA). Other annealing parameters or techniques may also be useful to form the salicide contacts.

In some embodiments, the salicide block is removed in subsequent processes, for example, a wet removal process. Other removal processes, for example RIE, may also be useful.

The process continues to form the device. The processing may include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

The various embodiments described herein may include field structures to increase gate dielectric breakdown voltage. For example, a field structure may be provided to surround the drain of a transistor. The field structure may be coupled to an opposite potential than the drain, such as the source, during operation. Such field structures are described, for example, in co-pending application Ser. No. 13/276,301 entitled "High Voltage Device", which is herein incorporated by reference for all purposes.

The various embodiments described herein may also include a split doped gate to increase switching speed. For example, the split doped gate includes a split doped gate electrode having different doped portions along the channel length direction of the gate. Such split doped gate are described, for example, in co-pending application Ser. No. 13/352,248 entitled "High Voltage Device", which is herein incorporated by reference for all purposes.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate having a device region, wherein the device region comprises a source region, a gate and a drain region defined thereon;
   forming a drift well in the substrate adjacent to a second side of the gate, the drift well underlaps a portion of the gate with a first edge of the drift well beneath the gate, wherein the drift well comprises first polarity type dopants;
   forming a secondary portion in the drift well, the secondary portion underlaps a portion of the gate with a first edge of the secondary portion beneath the gate, wherein the first edge of the secondary portion is offset from the first edge of the drift well, and wherein the secondary portion comprises neutral dopants; and
   wherein a gate dielectric of the gate comprises a first portion having a first thickness and a second portion having a second thickness, wherein the second portion is over the secondary portion.

2. The method of claim 1 wherein the neutral dopants comprise fluorine, chlorine, germanium, silicon or a combination thereof.

3. The method of claim 2 wherein the dopant concentration of the neutral dopants is about $1E14-1E16/cm^2$.

4. The method of claim 3 wherein the neutral dopants enhance oxide growth on the substrate surface.

5. The method of claim 4 wherein an interface of the first and second portion of the gate dielectric is aligned with the first edge of the secondary portion.

6. The method of claim 5 wherein the first thickness of the gate dielectric is smaller than the second thickness of the gate dielectric.

7. The method of claim 6 further comprising forming an internal device isolation region along a channel width direction in the substrate between the gate and drain.

8. The method of claim 7 wherein the drift well encompasses the drain and internal device isolation region.

9. The method of claim 8 further comprising forming an isolation region, wherein the isolation region isolates the device region from other regions of the device.

10. The method of claim 9 further comprising forming a device well within the isolation region.

11. The method of claim 10 wherein the device well encompasses the source, drain drift well and internal isolation region.

12. The method of claim 6 further comprising forming a salicide block on the substrate over the drift well, wherein the salicide block is aligned with an edge of the gate and slightly overlaps the drain.

13. The method of claim 12 wherein the salicide block is an extension of the second portion of the gate dielectric.

14. A method of forming a semiconductor device comprising:
    providing a substrate having a device region, wherein the device region comprises a source region, a gate and a drain region defined thereon;
    forming a drift well having first polarity type dopants in the substrate adjacent to a second side of the gate, the drift well underlaps a portion of the gate with a first edge of the drift well beneath the gate;
    forming a secondary portion having neutral dopants in the drift well, the secondary portion underlaps a portion of the gate with a first edge of the secondary portion beneath the gate, wherein the first edge of the secondary portion is offset from the first edge of the drift well; and
    wherein a gate dielectric of the gate comprises a first portion having a first thickness and a second portion having a second thickness, wherein the second portion is over the secondary portion.

15. The method of claim 14 wherein the neutral dopants comprise fluorine, chlorine, germanium, silicon or a combination thereof.

16. The method of claim 15 wherein the dopant concentration of the neutral dopants is about $1E14$-$1E16/cm^2$.

17. The method of claim 16 wherein an interface of the first and second portion of the gate dielectric is aligned with the first edge of the secondary portion.

18. A semiconductor device comprising:
    a substrate having a device region, wherein the device region comprises a source region, a gate and a drain region defined thereon;
    a drift well in the substrate adjacent to a second side of the gate, the drift well underlaps a portion of the gate with a first edge of the drift well beneath the gate;
    a secondary portion having neutral dopants in the drift well, the secondary portion underlaps a portion of the gate with a first edge of the secondary portion beneath the gate, wherein the first edge of the secondary portion is offset from the first edge of the drift well; and
    wherein a gate dielectric of the gate comprises a first thickness for a first portion and a second thickness for a second portion, wherein the second portion is over the secondary portion.

* * * * *